US007332402B2

(12) United States Patent
Freeman

(10) Patent No.: US 7,332,402 B2
(45) Date of Patent: Feb. 19, 2008

(54) METHOD FOR OPTICALLY TRIMMING ELECTRONIC COMPONENTS

(75) Inventor: William Freeman, Castro Valley, CA (US)

(73) Assignee: Finisar Corporation, Sunnyvale, CA (US)

( * ) Notice: Subject to any disclaimer, the term of this patent is extended or adjusted under 35 U.S.C. 154(b) by 135 days.

(21) Appl. No.: 10/846,210

(22) Filed: May 14, 2004

(65) Prior Publication Data

US 2004/0214452 A1 Oct. 28, 2004

Related U.S. Application Data

(63) Continuation-in-part of application No. 10/689,456, filed on Oct. 20, 2003, now abandoned.

(60) Provisional application No. 60/419,356, filed on Oct. 18, 2002.

(51) Int. Cl.
*H01L 21/20* (2006.01)
*H01L 21/00* (2006.01)

(52) U.S. Cl. ................. 438/382; 436/795; 257/E21.004

(58) Field of Classification Search ................. 438/382; 257/E21.004, E21.005
See application file for complete search history.

(56) References Cited

U.S. PATENT DOCUMENTS

| 5,470,606 | A | * | 11/1995 | De Boer | 427/64 |
| 5,855,755 | A | * | 1/1999 | Murphy et al. | 205/122 |
| 6,057,180 | A | | 5/2000 | Sun et al. | |
| 6,156,394 | A | | 12/2000 | Schultz Yamasaki et al. | |
| 6,671,443 | B2 | * | 12/2003 | Deliwala | 385/125 |
| 6,678,082 | B2 | | 1/2004 | Pike et al. | |

* cited by examiner

*Primary Examiner*—Lex Malsawma
(74) *Attorney, Agent, or Firm*—Workman Nydegger

(57) ABSTRACT

Methods for adjusting the bulk material properties of manufactured components, such as resistors, thermistors, varistors, capacitors, resonators, oscillators, and optical components. Adjustment of the resistance of a resistor can be achieved by directing a high energy beam, such as an ultraviolet beam, onto a resistor formed from a matrix component and an embedded conductive component. The high energy beam adjusts the resistivity of the resistor material substantially without ablating the matrix component by affecting the matrix component, the conductive component, or both. Because of the lack of ablation, the material having a property to be adjusted can be a sub-layer in a laminated structure, with the high energy beam being directed through other layers formed thereon.

25 Claims, 3 Drawing Sheets

METHOD FOR OPTICALLY TRIMMING ELECTRONIC COMPONENTS

CROSS-REFERENCE TO RELATED APPLICATIONS

This application is a continuation-in-part application of U.S. patent application Ser. No. 10/689,456, filed Oct. 20, 2003, now abandoned and entitled "Optically Trimming Electronic Components," which application claims the benefit of U.S. Provisional Application Ser. No. 60/419,356, filed Oct. 18, 2002, both of which applications are incorporated herein by reference.

BACKGROUND OF THE INVENTION

1. The Field of the Invention

The present invention generally relates to electronic and optical components. In particular, the present invention relates to a method for selectively modifying specified bulk properties of electronic and optical components, such as are found in integrated circuits and the like.

2. Related Technology

The importance of integrated circuits and the products made therefrom cannot be underestimated. Innumerable products featuring electronic components have been incorporated into nearly every facet of modern living. Such electronic products commonly include an integrated circuit ("IC"), which typically comprises a large number of miniaturized electronic components that are mounted on a printed circuit board ("PCB"), in order to provide the needed electronic functionality of the product.

During IC manufacture, much care is taken by the manufacturer to ensure that the various electronic components that comprise the IC possess operating characteristics that fall within an acceptable specification range. For instance, a resistor should possess a resistance that conforms to a desired specification. Such resistors are typically manufactured as "thin film" or "thick film" components on the PCB. In an untrimmed state, these resistors have tolerances in the range of a few percent for thin film and 5% to 15% for thick film.

If the IC component as manufactured does not possess the proper characteristics, it may be possible to modify, or tune, its operating characteristics. "Tuning" is generally referred to as the process by which one or more operating characteristics of an electronic component, such as an IC resistor, is modified. In resistors and other IC components, tuning is often accomplished by a method known as "trimming." Known trimming techniques alter the resistive properties of the resistor, for instance, by removing resistor material therefrom. This removal is typically accomplished by mechanical ablation of a portion of the resistor by a laser device.

Despite its usefulness, several drawbacks exist with known laser trimming techniques. For example, the material removed from the resistor creates residue, which must be removed from the surface of the PCB after trimming, so as to avoid contamination thereof. This may often require an extra cleaning step during the manufacture of the PCB. Because it is a mechanical process, laser trimming is often limited to the top layer of a multi-layer PCB. Also, the nature of the resistor after treatment with known laser trimming techniques may cause undesired signal reflections from the resistor, as well as electromagnetic interference ("EMI") from the resistor, during operation of the IC. Further, mechanical laser trimming often requires the use of select-on-test procedures for evaluating the success of the trimming procedure. Select-on-test evaluation is an expensive and slow process, which undesirably increases the time of manufacture for each PCB. As an alternative to mechanical laser trimming, other tuning techniques, such as thermal or electrical tuning, may be used to modify the bulk properties of electronic components. However, these techniques may also be either undesirable or unavailable depending on the type of PCB because of the risk of thermal or electrical damage to sensitive IC components.

A need therefore exists for a method of modifying the bulk properties of electronic components such as IC resistors without also creating the need for subsequent cleaning operations. A corresponding need also exists for a tuning method that reduces the chances for signal reflection and EMI during operation of the IC. Such a method should also provide for dynamic or active tuning of the electronic component, thus avoiding slower select-on-test circuit evaluation procedures that result in added fabrication/calibration expense. This method would desirably be used to tune components within single or multiple layer PCB structures, as well as non-IC electronic components. Finally, a need exists for a method that also allows for the modification of the bulk properties of optical components as well.

BRIEF SUMMARY OF THE INVENTION

Embodiments disclosed herein relate to methods for optically modifying the bulk properties of electronic and optical components. These components may comprise a portion of an integrated circuit ("IC"), or of any other suitable apparatus that employs such components. Examples, of such components are multichip modules ("MCMs"), multilayer hybrids such as low temperature cofired ceramic ("LTCC") and multilayer glass substrates ("MGS"), which is the subject of another related patent on MGS and low temperature bonding. Also disclosed herein are methods for tuning the bulk properties of electronic and optical components in a dynamic or active fashion, thereby saving manufacturing time and resulting in a more efficient fabrication process of the IC or associated apparatus. These methods also allow for the bulk property modification of these electrical components without creating the need for cleaning the surface of the printed circuit board ("PCB") or electronic substrate supporting the IC after the tuning is performed. Further, multi-layer PCB's and similar substrates may be tuned using these methods. The operating characteristics of the particular electronic component, such as a resistor, can be improved by reducing signal reflection by the component as well as reducing electromagnetic interference ("EMI"), which in turn helps eliminate circuit variations that may degrade the performance of the IC. The eye diagram of electronic components optically trimmed may be substantially improved.

In one embodiment, the component having a bulk material property to be adjusted is a resistor formed from a matrix component and a conductive component. The adjustment can be performed in response to a determination that the resistance of the resistor does not meet specifications. In a first example, the matrix component is a cross-linkable polymer, while the conductive component is formed from carbon particles embedded in the matrix component. The resistivity of the material that forms the resistor and, consequently, the resistance of the resistor, can be reduced by directing a high energy beam, such as an ultraviolet beam, onto the resistor. The matrix component shrinks and brings the carbon particles closer together, thereby reducing resistivity of the material and the resistance of the resistor.

In a second embodiment, the conductive component is introduced into the matrix component, whereby the conductivity of the conductive component is directly changed by exposure to the appropriate wavelength of light. Advantageously, this embodiment does not rely on a physical size change and internal movement of the matrix component.

In a third embodiment, the matrix component can be caused to react with the conductive component. For example, the matrix component can be formed from a sol-gel, while the conductive component is formed from a suboxide material, such as a silicon suboxide or a titanium suboxide. In this case, the high energy beam directed onto the resistor causes oxygen in the sol-gel material to react with the suboxide material, thereby increasing resistivity of the material and the resistance of the resistor.

In any of these cases, substantially no ablation occurs. These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

Figure 1:
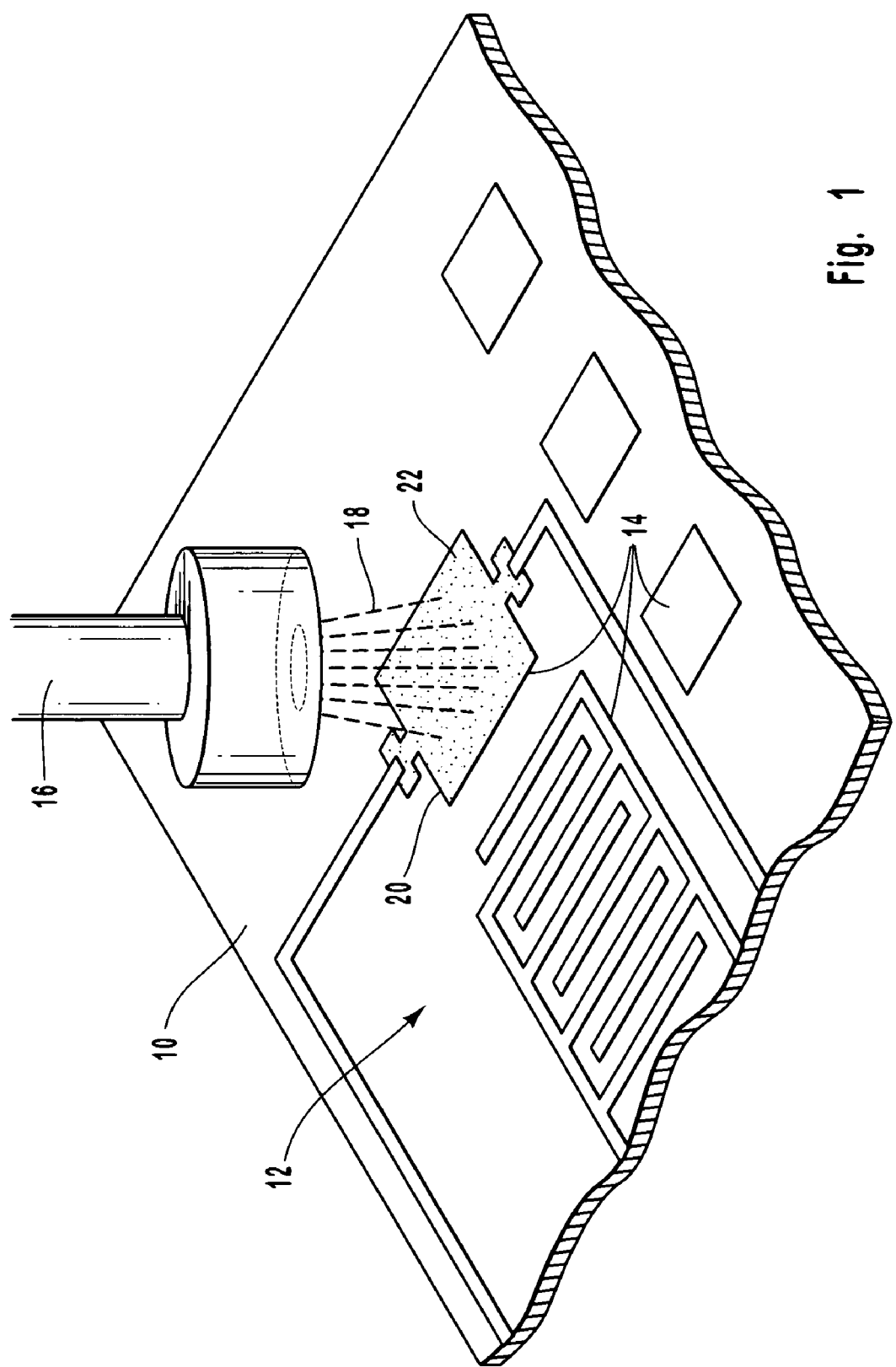
FIG. 1 is a perspective view of a portion of a printed circuit board having disposed thereon various electronic components, and a high energy beam source directed toward a selected electronic component in accordance with an embodiment of the present invention.
Figure 2B:
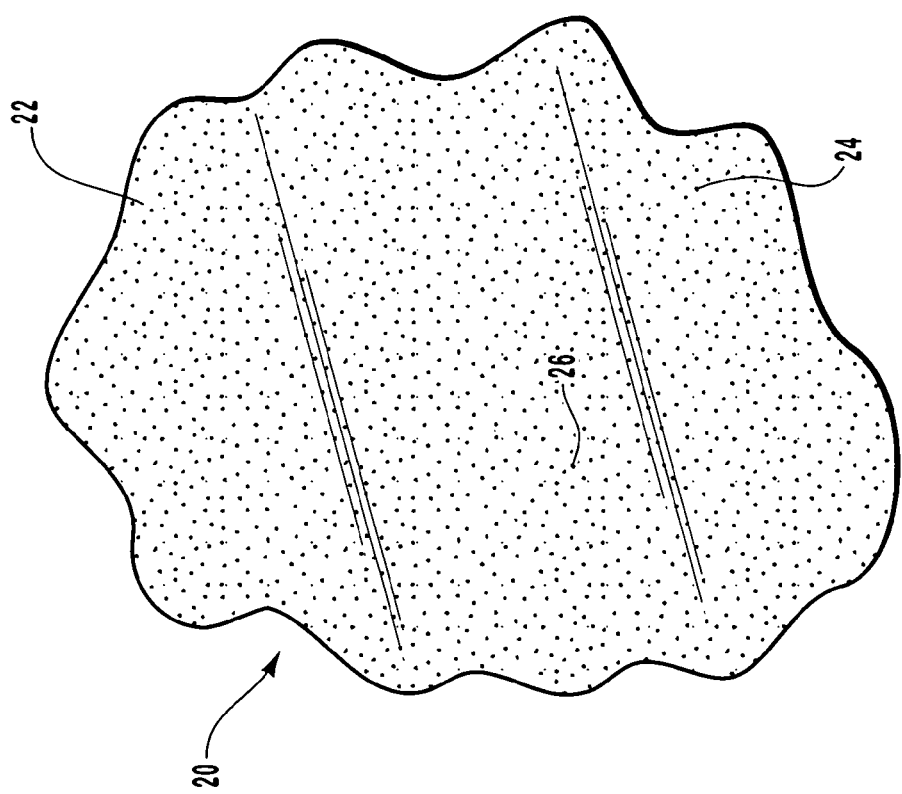
FIG. 2B is a top close-up view of the resistor portion of FIG. 2A, showing the relative decrease in distance between conductive particles within the resistive material that results from application of one embodiment of the present method.
Figure 2A:
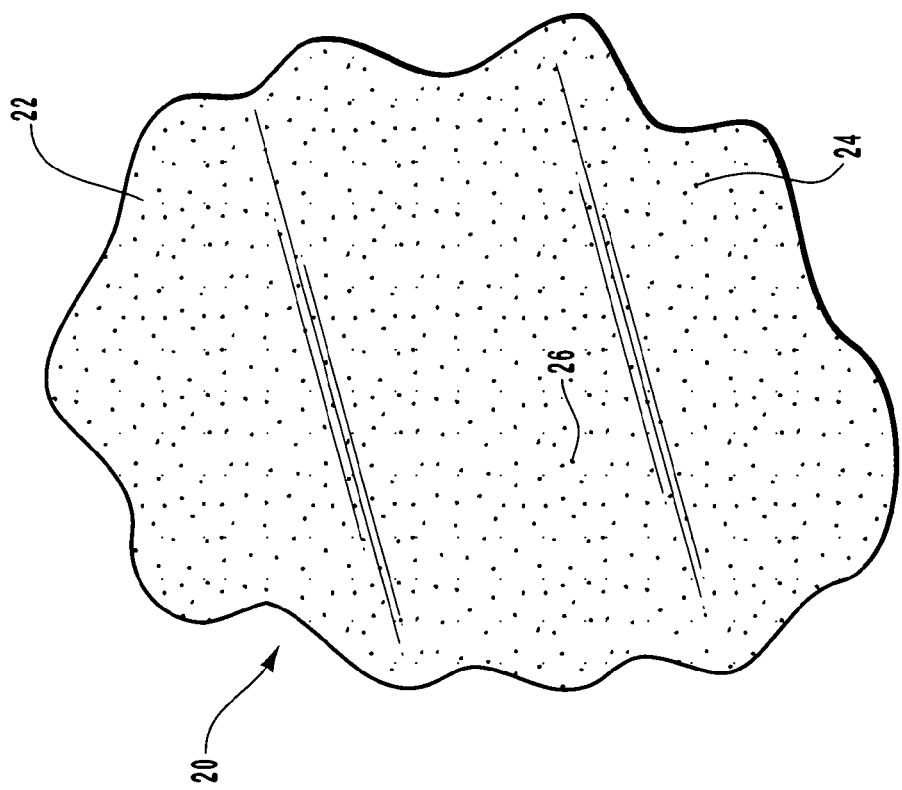
FIG. 2A is a top close-up view of a portion of a resistor disposed on a printed circuit board, showing the relative distribution of conductive particles within the resistor material.
Figure 3:
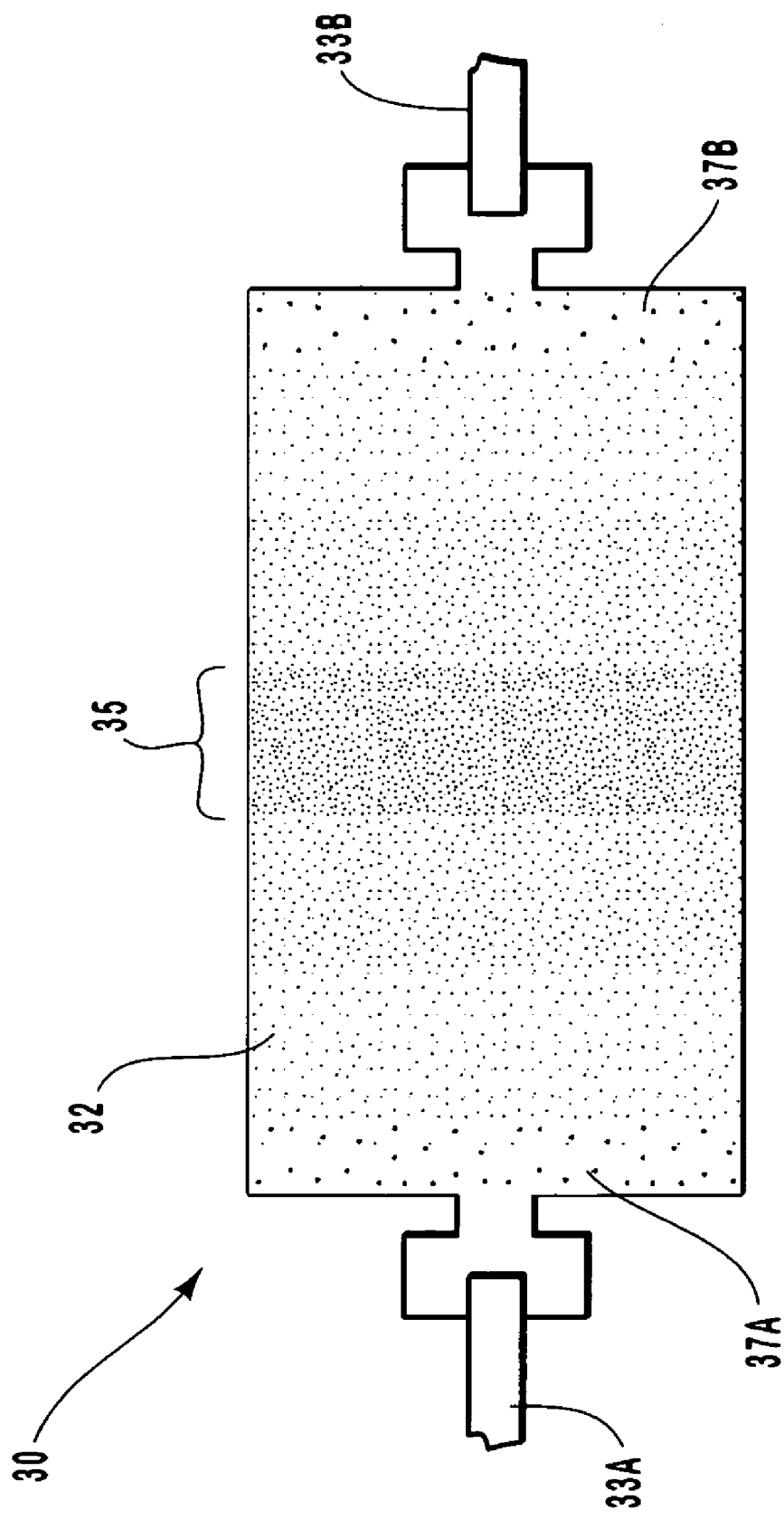
FIG. 3 is a top view of a resistor disposed on a printed circuit board, showing a graded resistive material resulting from application of one embodiment of the present method.

Various details of embodiments of the present invention are shown in FIGS. 1-3. Briefly summarized, embodiments of the present invention are directed to a method for optically modifying the bulk properties of electronic and optical components. These components may comprise a portion of an integrated circuit ("IC"), or of any other suitable apparatus that employs such optical and/or electronic components. Embodiments of the present invention further allow for the tuning of the bulk properties of electronic and/or optical components in a dynamic or active fashion, thereby saving manufacturing time and resulting in a more efficient fabrication process of the IC or associated apparatus.

These methods also allow for the bulk property modification of electrical components without creating the need for cleaning the surface of the printed circuit board ("PCB") or electronic substrate supporting the IC after the tuning is performed. In addition, optical and/or electronic components embedded within a multilayer stack of substrates can be tuned. Preferably, the substrate material, or, in particular, the path to the optical and/or electronic component, is sufficiently transparent to the tuning wavelength. Further, multi-layer PCB's and similar substrates may be tuned using this method. Advantageously, embodiments of the present invention improve the operating characteristics of the particular electrical component, such as a resistor, or optical component by reducing signal reflection by the electrical and/or optical component as well as reducing electromagnetic interference ("EMI"), which in turn helps eliminate circuit variations that may degrade the performance of the IC. Desirably, the eye diagram of electronic components optically trimmed may be substantially improved.

Reference is first made to FIG. 1, which illustrates in a general fashion the various components employed in one exemplary embodiment of the present invention. As explained above, specified bulk properties of an electronic and/or optical component can be modified using the methods disclosed herein. Specifically, the electrical and/or optical component is optically trimmed by a high energy beam, such as a beam of ultraviolet light. "Trimming" as used herein, is understood to mean the modification of a selected bulk property of an electronic or optical component.

FIG. 1 shows a printed circuit board, or PCB, designated generally at 10. The PCB 10 includes an integrated circuit 12 comprising a plurality of electronic components 14. FIG. 1 also illustrates a high energy beam source 16 emitting a high energy beam 18. In preferred embodiments, the high energy beam 18 substantially comprises ultraviolet light. However, it is understood that the high energy beam 18 could comprise electromagnetic radiation having a wavelength distinct from that of ultraviolet radiation, or even energetic particles. Examples of such other beams 18 include electron, x-ray, gamma ray, and particle beams. Indeed, it is appreciated that a variety of beams having sufficiently high energy may be advantageously employed in the method of the present invention.

The high energy beam source 16 is shown in FIG. 1 directing the high energy beam 18 toward a resistor 20. Resistor 20 is only one type of electronic or optical component that may benefit from the practice of the methods disclosed herein. Indeed, and as will be further described below, various electronic and optical components may be modified in their bulk properties by practice of the present invention. Therefore, even though the following discussion concentrates on the optical trimming of the resistor 20, an electronic component, it is understood that this is merely exemplary of the present method, and is not limiting of the scope of the present invention.

The specified electronic component 14 is affected by the high energy beam 18 produced by the beam source 16 such that the desired bulk property of the component is altered. As seen in FIG. 1, the resistor 20 has incident upon it the high energy beam 18. In one embodiment, this enables the high energy beam 18 to modify the resistive properties of the resistor 20. This alteration of the resistivity of the material that forms the resistor and, consequently, the alteration of the resistance of the resistor, may be desirable, for example, if a proper level of resistance was not achieved during initial fabrication of the resistor 20. Thus, it is seen that a major advantage of the present methods for optically trimming electronic or optical components is the ability to bring into specification those optical and/or electrical components that, for one reason or another, were not manufactured according to desired specifications. As already noted, these methods are not limited to the modification of resistors; indeed, various electronic and optical components may be improved by the present invention. For instance, the dielectric constant of a capacitor disposed in an IC may be altered so as to give the capacitor a desired capacitance. More details concerning components that may benefit from the present invention are discussed further below.

The operating characteristics of the high energy beam 18, such as the energy and time of exposure, are dependent upon several factors, including the extent to which the bulk property electronic of the component 14 requires modification, the type of material comprising the electronic component, etc. In one embodiment, deep ultraviolet light is employed as the high energy beam 18, preferably having a wavelength range of from about 60-300 nm.

Attention is now directed to FIGS. 2A and 2B, which show top views of the surface of the resistor 20 shown in FIG. 1. As has been discussed, according to one embodiment of the present invention, the resistor 20 may be optically trimmed so as to modify the resistance of the material comprising the resistor. In order for the high energy beam 18 to appropriately modify the resistor 20, the resistor should be formed from a resistive material 22 that is susceptible to change when the high energy beam is incident upon it. An example of the resistive material 22 is shown in FIGS. 2A and 2B. In one embodiment, the resistive material 22 comprises a matrix component 24 and a conductive component 26. Though the matrix component 24 and the conductive component 26 may comprise a variety of combinations, in the present embodiment, the matrix component 24 comprises a cross-linkable polymer, such as a methacrylate or vinyl polymer, combined in matrix form with cetyltrimethyl ammonium bromide ("CTAB"). The conductive component 26 is embedded within the matrix component 24 and comprises carbon particles in the present embodiment, though any other appropriate substance having the desired resistive characteristics may also be employed.

According to one embodiment of the present invention, the resistive material 22 is formed by known fabrication procedures and incorporated into the resistor 20. At least a portion of the resistor 20 after formation is then exposed to the high energy beam 18 of the beam source 16, as shown in FIG. 1. FIG. 2A shows the resistive material 22 before treatment by the high energy beam 18. As can be seen in FIG. 2A, the carbon particles comprising the conductive component 26 are spaced relatively far apart from one another. The exposure of the high energy beam 18 upon the resistive material 22 of the resistor 20 causes the matrix component 24 of the resistive material 22 to shrink, as is seen in FIG. 2B. The shrinkage of the matrix component 24 causes the average spacing of the embedded carbon particles of the conductive component 26 to decrease. The net result of the shrinkage of the resistive material 22, then, is a net decrease in the resistance of the resistive material 22, given the now decreased relative inter-particle distance of the carbon particles.

Thus, the present method for optical trimming can alter the bulk property of an electronic and/or optical component, in this case the resistance of the resistor 20. Advantageously, this modification of the resistance of the resistor 20 is accomplished optically and not mechanically, as is the case with known laser trimming techniques. Thus, no ablated material is created, thereby precluding the need for cleaning the surface of the PCB 10 after trimming. Further, because no ablation material is created, the present method may be used to alter electronic and/or optical components that reside one or more layers below the surface of the PCB 10 or other substrate. It should also be understood that, though the present discussion focuses on the trimming of electronic and optical components disposed in an IC, non-IC components may also be modified as may be appreciated by one skilled in the art.

In another embodiment, the conductive component, instead of the matrix component, is altered in some manner by exposure to the appropriate wavelength of light or other energy source. Advantageously, this embodiment does not rely on a physical size change and internal movement of the matrix component.

In yet another embodiment, the matrix component can be caused to react with the conductive component so that the bulk property of the optical and/or electrical component is altered. In an example, a matrix component 24 comprises sol-gel having embedded therein a conductive component 26 comprising a conductive suboxide, such as silicon suboxide or titanium suboxide. In this case, the conductive suboxide comprising the conductive component 26 induces the attraction of additional oxygen to combine with the suboxide when the resistive material 22 is exposed to the high energy beam 18 of ultraviolet light. The gathering of oxygen by the conductive suboxide in this case results in a net increase of the resistance of the conductive component of the resistive material 22, thus raising the bulk property resistance of the resistor 20.

The matrix component comprising sol-gel having a conductive component embedded therein is one example of using an oxidation/reduction (redox) reaction to change the bulk properties of the optical and/or electrical component. In this embodiment, the conductive component includes metal oxides whose oxidation state, which determines the conductivity, can be changed by photo-induced redox reactions. This method centers around the idea that the conductive component, and possibly the matrix itself, form a redox pair such that the oxidation-reduction reaction can be thermally or photo catalytically induced by a laser or other means.

Thus, the bulk properties of the optical and/or electrical component can be modified in at least the following ways: (1) the matrix component may be modified, generally by cross linking, so that the size of the matrix component can be altered; (2) the nature of the conductive component may be modified; or (3) the matrix component and conductive component can be caused to react together to change the bulk property of the material.

In addition to optically trimming resistors, other embodiments of the present invention are able to modify the bulk properties of other electronic components 14. As mentioned above, the dielectric constant of a capacitor may be modified in accordance with desired specifications. The rate constant of thermistors, the threshold of varistors, and the magnetic susceptibility of ferrite materials are some examples of materials properties that may be trimmed by these methods. Likewise, electronic components such as resonators or oscillators may be modified so as to yield desired characteristics with respect to Young's modulus. The bulk physical dimensions of an electronic component may be modified or aligned in situ. Or, more generally, the bulk chemical properties of an electronic component may be altered using the optical trimming procedures outlined herein. Thus, the examples given above are merely exemplary of the type of bulk property modification that is possible with the present invention, and thus are not limiting of its scope.

The bulk properties of optical components may also be modified by the present invention. Examples of this include the modification of the bulk refractive index of an optical component, or the alteration of the crystalline, matrix size, and opacity of an optical component. Further, photonic crystals may be advantageously improved in terms of their bulk properties by employing the methods disclosed herein.

Reference is now made to FIG. 3, which illustrates a top view of a resistor 30 comprising a portion of an integrated circuit 12. The resistor 30 is at least partially comprised of a resistive material 32 that has been modified in its resistance according to the present invention. As can be seen from the figure, the resistor 30 is electrically connected to the rest of the integrated circuit 12 by traces 33A and 33B, as is well known in the art. The resistive material 32 has been treated in accordance with the principles of the present invention by a high energy beam 18 such that the resistance of the resistor 30 varies as a function of position along the length of the resistor body. Treatment of the resistive material 32 by the high energy beam 18 has been accomplished so as to create a relatively higher resistance region in a middle portion 35 of the resistor 30. The resistance of the resistor 30 progressively diminishes toward each of the traces 33A and 33B such that the resistance of the resistive material 32 near ends 37A and 37B of the resistor 30 is lowest.

Thus, FIG. 3 shows a resistor with graded impedance terminations to the traces. The resistance of the interior, middle portion is significantly greater than the portion near the traces. The resistor 30 is treated by the high energy beam 18 comparatively more at the middle portion 35 of the resistor than near the end portions of 37A and 37B in order to achieve this desired resistance. FIG. 3 shows this relative resistance differential by varying shades. The treatment of the resistor 30 to have the graded resistance described above is desirable in several respects. First, such a resistive grading reduces abrupt resistive transitions in or near the resistor 30, which helps reduce signal reflection. Second, EMI is reduced, thereby reducing interference with adjacent electronic components disposed on the PCB 10.

It is appreciated that the high energy beam source 16 may be employed to alter a selected bulk property of the electronic component 14 not only in a homogenous manner, as shown in FIGS. 2A and 2B, but also in a graded pattern, as shown in FIG. 3, or in some combination of these patterns. Thus the electronic component 14 may be altered as may suit the particular application in which the device will function.

In another embodiment of the present invention, optical trimming may be used to alter the dielectric constant of material surrounding a trace on the PCB 10. This alteration modifies the phase delay of the electric signal passing through the trace. Thus precise tuning of the phase delay through the trace is possible. Additionally, coupled transmission lines may be similarly tuned. Advantageously, the optical and/or electrical components can be trimmed during a functional test after the PCB like structure has been assembled, thus eliminating guesswork, select-on-test, or other expensive and time consuming manufacturing techniques designed to narrow the distribution of a critical parameter. In one aspect, the present disclosure describes some methods for dramatically narrowing the distribution of certain electrical and optical parameters either stand alone or in relation to other parameters of a manufactured device.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

I claim:

1. A method for adjusting a bulk property of a component, comprising:
   identifying in a resistor a matrix component having an embedded conductive component; and
   differentially directing a beam onto different portions of the resistor such that a resistance of the matrix component so as to obtain a gradient of the resistance over a dimension of the matrix component.

2. The method of claim 1, wherein the embedded conductive component comprises conductive particles embedded in the matrix component.

3. The method of claim 1, wherein, in response to the beam, the resistance is adjusted substantially without ablation of the matrix component.

4. The method of claim 1, wherein the resistor comprises a first layer that includes the matrix component and the embedded conductive component and a second layer that is formed over the first layer, such that the beam is directed through the second layer onto the first layer.

5. The method of claim 1, wherein the matrix component comprises a sol-gel material.

6. The method of claim 5, wherein the conductive component comprises a conductive suboxide material.

7. The method of claim 6, wherein the conductive suboxide material comprises one of silicon suboxide and titanium suboxide.

8. The method of claim 6, wherein, in response to application of the beam, oxygen included in the sol-gel material combines with the conductive suboxide material, resulting in a change to a bulk property of the resistor.

9. The method of claim 1, further comprising connecting the resistor to a printed circuit board prior to directing the beam onto the resistor.

10. A method for adjusting a bulk property, comprising:
    obtaining a resistor having a resistance that is to be adjusted, the resistor formed from:
      a matrix component comprising a cross-linkable polymer including carbon particles disposed therein; and
      an embedded conductive component; and
    directing a beam onto the resistor such that the resistance of the resistor is adjusted,
    wherein, in response to the beam, the matrix component shrinks, thereby reducing an average spacing between the carbon particles and reducing the resistance of the resistor.

11. The method of claim 10, wherein the matrix component comprises a methacrylate polymer combined in a matrix form with cetyltrimethyl ammonium bromide.

12. The method of claim 10, wherein the matrix component comprises a vinyl polymer combined in a matrix form with cetyltrimethyl ammonium bromide.

13. The method of claim 10, wherein the embedded conductive component comprises conductive particles embedded in the matrix component.

14. The method of claim 13, wherein the conductive particles comprise carbon particles.

15. The method of claim 10, wherein, in response to the beam, the resistance of the resistor is reduced substantially without ablation of the matrix component.

16. The method of claim 10, wherein the resistor comprises a first layer that includes the matrix component and the embedded conductive component and a second layer that is formed over the first layer, such that the beam is directed through the second layer onto the first layer.

17. A method for adjusting a bulk property, comprising:
obtaining a resistor having a resistance that is to be adjusted, the resistor formed from:
a matrix component comprising a sol-gel material; and
an embedded conductive component comprising a conductive suboxide material comprising one of one of silicon suboxide or titanium suboxide; and
directing a beam onto the resistor such that the resistance of the resistor is adjusted,
wherein, in response to the beam, oxygen included in the sol-gel material combines with the conductive suboxide material, thereby increasing the resistance of the resistor.

18. A method for adjusting a bulk property, comprising:
obtaining a resistor having a resistance that is to be adjusted; and
differentially directing the a beam onto different portions of the resistor such that the resistance of the resistor is adjusted so as to obtain a gradient of the resistance over a dimension of the resistor.

19. The method of claim 18, wherein the gradient of the resistance operates to reduce abrupt resistive transitions in the resistor compared to the abrupt resistive transitions that would have existed in the absence of the gradient of the resistance.

20. The method of claim 19, wherein reduction of the abrupt resistive transitions reduces signal reflection during operation of the resistor.

21. The method of claim 19, wherein reduction of the abrupt resistive transitions reduces electromagnetic interference associated with operation of the resistor.

22. The method of claim 18, further comprising connecting the resistor to a printed circuit board prior to directing the beam onto the resistor.

23. A method for manufacturing a resistor, comprising:
obtaining a resistor having a resistance and being formed from a matrix component and an embedded conductive component; and
differentially directing a high energy beam onto different portions of the resistor, such that a gradient of the resistivity of the resistor across a dimension of the resistor is achieved, the high energy beam being directed onto the resistor in a manner such that substantially none of the matrix component ablates.

24. The method of claim 23, wherein:
the matrix component comprises a cross-linkable polymer; and
the conductive component comprises carbon particles.

25. The method of claim 23, wherein:
the matrix component comprises a sol-gel material; and
the conductive component comprises one of silicon suboxide and titanium suboxide.

* * * * *